United States Patent

Prester et al.

[11] Patent Number: 6,042,689
[45] Date of Patent: Mar. 28, 2000

[54] APPARATUS FOR JOINING FLAT ELECTRICAL COMPONENTS OF VARIABLE SIZE

[75] Inventors: Franz Prester, Regensburg; Rudolf Schindler, Maxhütte-Haidhof, both of Germany

[73] Assignee: Siemens Aktiengesellschaft, Munich, Germany

[21] Appl. No.: 09/078,177

[22] Filed: May 13, 1998

[30] Foreign Application Priority Data

May 13, 1997 [DE] Germany .......................... 197 19 906

[51] Int. Cl.[7] .............................. B32B 31/20; B30B 1/00; B29C 43/52
[52] U.S. Cl. ...................... 156/583.1; 156/381; 100/315; 100/320
[58] Field of Search ................................ 156/583.1, 381; 100/214, 315, 318, 319, 320

[56] References Cited

U.S. PATENT DOCUMENTS

| | | |
|---|---|---|
| 3,570,060 | 3/1971 | Stephenson .............................. 100/214 |
| 3,709,457 | 1/1973 | Church ...................................... 249/91 |
| 5,468,315 | 11/1995 | Okada et al. .............................. 156/64 |
| 5,469,779 | 11/1995 | Amore et al. ........................ 100/319 X |
| 5,507,038 | 4/1996 | Cook et al. .............................. 455/351 |
| 5,555,798 | 9/1996 | Miyashita et al. ............... 156/583.1 X |
| 5,558,015 | 9/1996 | Miyashita et al. .................. 100/319 X |
| 5,578,159 | 11/1996 | Miyashita et al. ............... 156/583.1 X |
| 5,800,667 | 9/1998 | Kosaki et al. .................... 156/583.1 X |
| 5,817,210 | 10/1998 | Morin .............................. 156/583.1 X |

FOREIGN PATENT DOCUMENTS 065927 10/1995 Japan .

OTHER PUBLICATIONS

German Utility Model—Paper Presented During Conference: "Adhesivves in Electronics 1994" by Lindner, K. and Reinders, T.

*Primary Examiner*—Curtis Mayes
*Assistant Examiner*—Sue A. Purvis
*Attorney, Agent, or Firm*—Herbert L. Lerner; Laurence A. Greenberg; Werner H. Stemer

[57] ABSTRACT

An apparatus for joining flat electrical components uses a flexible foil with electrical conductor tracks and an electrically conductive adhesive. A workpiece receptacle receives workpieces to be joined, and a heatable die is pressed against the workpiece receptacle and in so doing adhesively bonds the workpieces under the influence of heat and pressure and electrically conductively joins them to one another. Resiliently supported metal peripheral elements which are disposed on both sides next to the workpiece receptacle, are adapted in terms of their spacing to the width of the respective workpiece. In particular, LCD components and printed circuit boards are joined together, for example for on-board computers for motor vehicles, for telephones and for other devices equipped with liquid crystal displays.

3 Claims, 1 Drawing Sheet

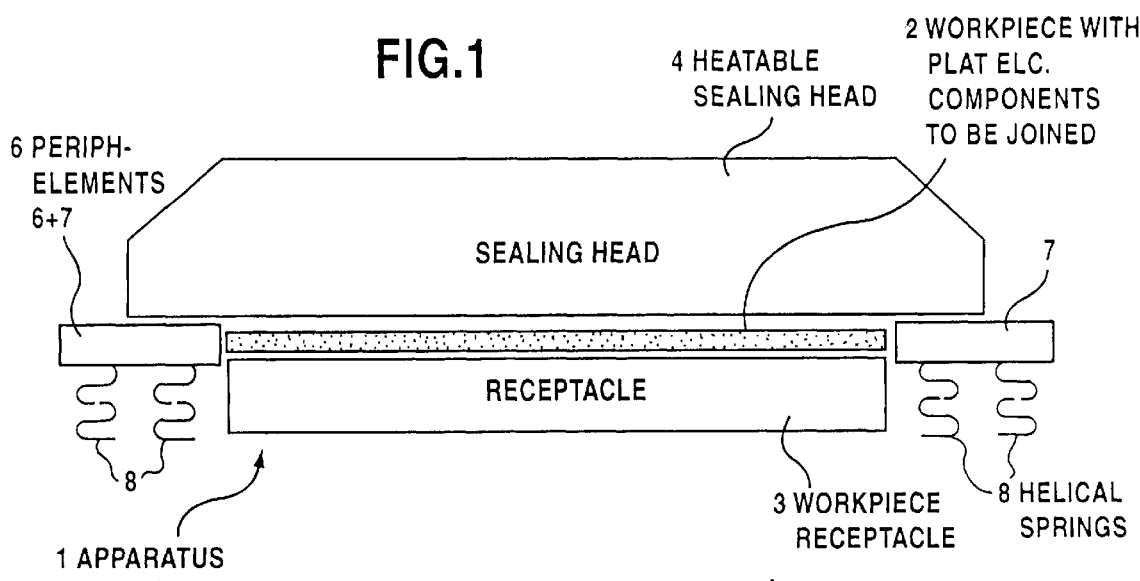
FIG. 1
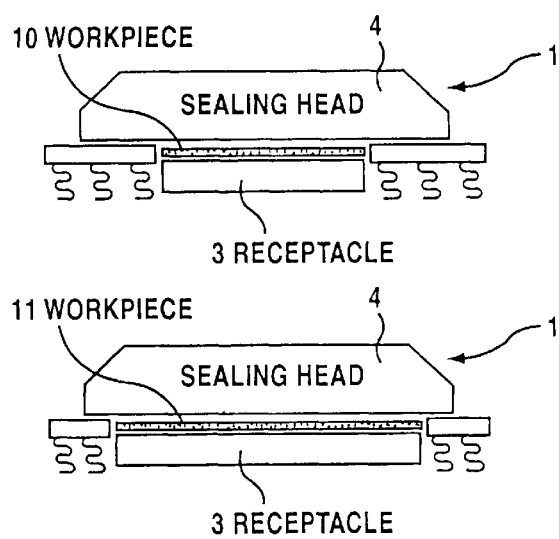
FIG. 2
FIG. 3
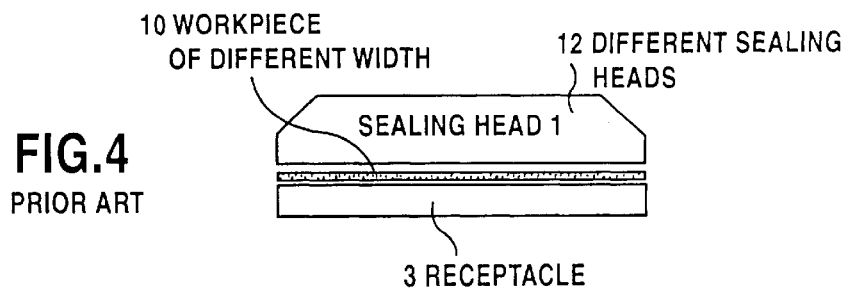
FIG. 4
PRIOR ART
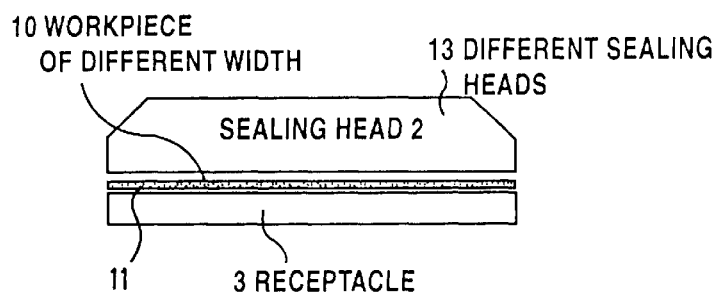
FIG. 5
PRIOR ART 6,042,689

APPARATUS FOR JOINING FLAT ELECTRICAL COMPONENTS OF VARIABLE SIZE

BACKGROUND OF THE INVENTION

Field of the Invention

The invention relates to an apparatus for joining flat electrical components of variable size, with the aid of a flexible film that contains electrical conductor tracks and an electrically conductive adhesive.

So-called heat sealing systems are known in which printed circuit boards and LCDs (liquid crystal displays) are joined together with the aid of polyester film, also known as flex film, that is coated with conductor tracks, and an electrically conductive adhesive (see the paper by Karl Lindner et al. of Weld-Equip, entitled "Pulse heat bonding a method for interconnections with Anisotropic Conductive Adhesive Foil (ACAF) and Heat Seal Connectors (HSC)", presented at the conference entitled "Adhesives in Electronics 94"). In such systems, the parts to be joined together, for instance an LCD component and a printed circuit board, are placed in a work piece receptacle together with the polyester film that is constructed as a flexible printed circuit board.

An anisotropic conductive adhesive is applied to peripheral regions of the LCD component and the printed circuit board that are to be joined to the polyester film. A die with a heatable sealing head is then moved from above onto joining points. The adhesive melts and electrically conductively joins the two joining partners to one another under pressure and heat. The conductive adhesive is constructed in such a way that only the conductor tracks of the respective joining partners that are located directly one above the other are electrically conductively joined.

In the known system, different heating or sealing heads are needed for various printed circuit board and LCD sizes, and those heads are each directed especially to one product. A new heating dye must be prepared for every other product, however minimally it may differ in dimensions from the previous ones. That change also necessitates an adaptation of a production program and a change in operating parameters in the mass production of products.

U.S. Pat. No. 5,468,315 discloses a device for producing multi-layered ceramic printed circuit boards, which has a workpiece receptacle for the workpieces to be joined, a die that can be pressed against the workpiece receptacle and is heatable, and resiliently supported peripheral elements disposed on both sides next to the workpiece receptacle.

Published Japanese Patent Application JP 7-65927 also discloses a device for thermocompression bonding that has a resiliently supported peripheral element.

SUMMARY OF THE INVENTION

It is accordingly an object of the invention to provide an apparatus for joining flat electrical components of variable size, which overcomes the hereinafore-mentioned disadvantages of the heretofore-known apparatuses of this general type, which reduces expense for production and which simplifies mass production.

With the foregoing and other objects in view there is provided, in accordance with the invention, an apparatus for joining flat electrical components of variable size, with a flexible film containing electrical conductor tracks and with an electrically conductive adhesive, the apparatus comprising a workpiece receptacle to be adapted to a width of a respective workpiece having components to be joined; a heatable sealing head to be pressed against the workpiece receptacle for adhesively bonding and electrically conductively joining the components to one another under the influence of heat and pressure, the same sealing head being used for workpieces of different sizes; and resiliently supported peripheral elements disposed next to both sides of the workpiece receptacle, the peripheral elements adapted along with the workpiece receptacle to the width of the workpiece for jointly covering a region of the sealing head facing the workpiece receptacle, the workpiece and the peripheral elements, with the workpiece receptacle, the workpiece and the peripheral elements with.

In accordance with another feature of the invention, the peripheral elements are metal strips with good thermal conductivity.

In accordance with a concomitant feature of the invention, the apparatus joins a printed circuit board and a liquid crystal display component for an on-board computer for motor vehicles.

The advantages of the invention include, among others, the time savings attained in production because of the fact that there is no need to exchange heating dies for one another. The heat is moreover dissipated uniformly and reliably due to the resiliently supported metal pieces on both sides next to the workpiece receptacle. Conversion to another product during mass production is simplified substantially.

Other features which are considered as characteristic for the invention are set forth in the appended claims.

Although the invention is illustrated and described herein as embodied in an apparatus for joining flat electrical components of variable size, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of an apparatus according to the invention, transverse to a longitudinal direction of a workpiece;

FIGS. 2 and 3 are two sectional views on a reduced scale, showing two apparatuses according to the invention with workpieces of different dimensions; and FIGS. 4 and 5 are two other sectional views on a reduced scale, showing conventional heat sealing systems with different sealing heads adapted to dimensions of the respective workpiece.

DESCRIPTION OF THE PREFERRED EMBODIMENTS

Referring now to the figures of the drawings in detail and first, particularly, to FIG. 1 thereof, there is seen an apparatus 1 according to the invention which is used to join flat electrical components of a workpieces 2 with the aid of a flexible foil that contains electrical conductor tracks and with the aid of an electrically conductive adhesive. The parts to be joined are only diagrammatically shown herein in the form of a workpiece 2, because the details of the components to be joined and of the heat sealing technique are known per se, for instance from the conference paper cited above, and are not impacted by the invention.

An essential component of a pressing die is a heatable sealing head 4, which is driven downward onto the workpiece 2, presses the workpiece against a workpiece receptacle 3, adhesively bonds individual components of the workpiece to one another under the influence of pressure and heat and in the process also electrically conductively joins them.

Laterally, the workpiece 2 is bounded by two peripheral elements 6 and 7, which are resiliently disposed and rest resiliently on the sealing head 4 as the sealing head is moved downward. Since the peripheral elements 6, 7 are constructed as metal strips with good thermal conductivity, they reliably and uniformly dissipate the heat even from the peripheral regions of the sealing head. Overheating and possible damage to the heating elements of the sealing head 4 are averted by the peripheral elements. Moreover, thermal stress on the workpiece 2 is made more uniform.

According to the invention, one and the same sealing head 4 is used for workpieces 2 of different sizes. Only the single workpiece receptacle 3 is needed to accommodate a variable width. Accordingly, the workpiece receptacle 3 is adaptable to a width of a workpiece 2 having components to be joined. The workpiece receptacle 3 is physically interchangeable and the size of the workpiece receptacle 3 is related to the size of the workpiece 2. The peripheral elements 6, 7 are disposed laterally of the workpiece receptacle and at the same time serve to fix the position of the workpiece 2. As noted, they are supported elastically, with helical springs 8 in the illustrated exemplary embodiment.

It can be seen from FIGS. 2 and 3 that the same sealing head 4 can always be used for workpieces 10 and 11 of different widths. For the sake of comparison, FIGS. 4 and 5 show conventional heat sealing systems, in which a different sealing head 12 and 13 must be used in each case for workpieces 10 and 11 of different widths.

The size of the sealing head 4 of the apparatus 1 of the invention is selected in such a way that it suffices for the largest workpiece that will occur. It can also be used for all of the smaller workpieces. This considerably simplifies and speeds up conversion in the mass production of workpieces.

Through the use of the apparatus 1, it is possible in particular to join LCD components and printed circuit boards, for example for on-board computers for motor vehicles, telephones, and other devices equipped with liquid crystal displays.

We claim:

1. An apparatus for joining flat electrical components of variable size, with a flexible film containing electrical conductor tracks and an electrically conductive adhesive, the apparatus comprising:

a workpiece receptacle to be adapted to a width of a workpiece having components to be joined;

a heatable sealing head to be pressed against said workpiece receptacle for adhesively bonding and electrically conductively joining the components to one another under the influence of heat and pressure, in workpieces of different sizes; and resiliently supported peripheral elements disposed next to both sides of said workpiece receptacle, said peripheral elements adapted along with said workpiece receptacle to the width of the workpiece for jointly covering a region of said sealing head facing said workpiece receptacle, the workpiece and said peripheral elements with the workpiece and said peripheral elements.

2. The apparatus according to claim 1, wherein said peripheral elements are metal strips with good thermal conductivity.

3. An apparatus for joining a printed circuit board and a liquid crystal display component of variable size for an on-board computer for motor vehicles, with a flexible film containing electrical conductor tracks and an electrically conductive adhesive, the apparatus comprising:

a workpiece receptacle to be adapted to a width of a workpiece having components to be joined;

a heatable sealing head to be pressed against said workpiece receptacle for adhesively bonding and electrically conductively joining the components to one another under the influence of heat and pressure, in workpieces of different sizes; and resiliently supported peripheral elements disposed next to both sides of said workpiece receptacle, said peripheral elements adapted along with said workpiece receptacle to the width of the workpiece for jointly covering a region of said sealing head facing said workpiece receptacle, the workpiece and said peripheral elements with the workpiece and said peripheral elements.

* * * * *